(12) United States Patent
Yang et al.

(10) Patent No.: US 11,064,629 B2
(45) Date of Patent: Jul. 13, 2021

(54) DEVICE CASING WITH DETACHABLE BRACKET

(71) Applicants: Inventec (Pudong) Technology Corp., Shanghai (CN); Inventec Corporation, Taipei (TW)

(72) Inventors: Yuan-Chang Yang, Taipei (TW); Jeng-Ting Pan, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 16/706,845

(22) Filed: Dec. 9, 2019

(65) Prior Publication Data

US 2021/0076528 A1 Mar. 11, 2021

(30) Foreign Application Priority Data

Sep. 6, 2019 (CN) .......................... 201910844544.9

(51) Int. Cl.
*H05K 7/00* (2006.01)
*H05K 7/14* (2006.01)
*H05K 7/16* (2006.01)

(52) U.S. Cl.
CPC ............ *H05K 7/1489* (2013.01); *H05K 7/16* (2013.01)

(58) Field of Classification Search
None
See application file for complete search history.

(56) References Cited

U.S. PATENT DOCUMENTS

| 5,169,221 | A | * | 12/1992 | Wheeler | ................. | H05K 7/16 |
| | | | | | | 16/358 |
| 9,376,845 | B2 | * | 6/2016 | Sawaguchi | ............... | E06B 3/34 |
| 2006/0168759 | A1 | * | 8/2006 | Laursen | .................. | H04Q 1/09 |
| | | | | | | 16/358 |
| 2012/0299453 | A1 | * | 11/2012 | Dunham | ................. | G06F 1/183 |
| | | | | | | 312/244 |
| 2015/0167367 | A1 | * | 6/2015 | Sawaguchi | ............. | E05D 3/022 |
| | | | | | | 49/398 |

* cited by examiner

*Primary Examiner* — Anthony Q Edwards
*Assistant Examiner* — Rashen E Morrison
(74) *Attorney, Agent, or Firm* — Winston Hsu (57) ABSTRACT

A device casing includes a casing body and a detachable bracket. The casing body has first and second supporting frames opposite to each other, and first and second guiding slots formed on the first supporting frame. The first guiding slot has a first open end and a first closed end. The second guiding slot has a second open end and a second closed end. The detachable bracket is detachably disposed between the first and second supporting frames and has first and second sliding posts. The first sliding post is rotatably disposed at the first closed end. The second sliding post is slidably disposed at the second closed end. By the structural constraint between the first and second guiding slots and the first and second sliding posts respectively, the detachable bracket can stably rotate relative to the casing body and can be installed onto the casing body easily.

9 Claims, 7 Drawing Sheets

DEVICE CASING WITH DETACHABLE BRACKET

BACKGROUND OF THE INVENTION

1. Field of the Invention

The present invention relates to a device casing, and more particularly to a device casing with a detachable bracket.

2. Description of the Prior Art

Much electronic equipment (e.g. servers) is equipped with electronic components inside. In general, these electronic components are fixedly disposed individually, e.g. by screws. If the electronic components need to be maintained or replaced, the device casing needs to be opened and the screws needs to be loosened for convenience of operation. For this, some device casings are designed to have a rotatable and detachable bracket. Electronic components that are often in need of maintenance and replacement are disposed on the bracket and can be exposed out (or protrude out the interior of the device casing) by rotating the bracket for convenience of maintenance. If electronic components on the bracket need to be replaced or electronic components under the bracket need to be maintained, then the bracket has to be detached from the device casing. The bracket can be rotated generally through a hole and shaft fit; for example, holes on opposite sides of the bracket in coordination with pull pins on opposite sidewalls of the device casing can forma hinge structure for allowing rotation. The pull pins can be pulled till disengaging from the holes on the bracket, so as to move the bracket away from the device casing. When the bracket needs to be installed again, the holes of the bracket need to be aligned with the pull pins of the device casing at the same time for installing the bracket correctly. The installation is quite inconvenient. Furthermore, under a condition that the bracket is not detached from the device casing in some cases, the allowable rotation angle of the bracket relative to the device casing is not large and it is probably uneasy to make the bracket immovable, which is inconvenient for maintenance.

SUMMARY OF THE INVENTION

An objective of the invention is to provide a device casing, which can allow a bracket thereof to rotate stably and is convenient for installing the bracket by a structural constraint between a plurality of guiding slots and a plurality of corresponding sliding posts.

A device casing according to the invention includes a casing body and a detachable bracket. The casing body has a first supporting frame, a second supporting frame relative to the first supporting frame, and first and second guiding slots formed on the first supporting frame. The first guiding slot has a first open end and a first closed end. The second guiding slot has a second open end and a second closed end. The detachable bracket is detachably disposed between the first supporting frame and the second supporting frame and has a first sliding post and a second sliding post. The first sliding post is rotatably located at the first closed end. The second sliding post is slidably located at the second closed end. Thereby, a user can rotate the detachable bracket upward relative to the casing body by rotating the first sliding post at the first closed end and sliding the second sliding post in the second guiding slot, then make the first sliding post slide away from the first closed end, so that the first sliding post and the second sliding post can depart from the first guiding slot and the second guiding slot through the first open end and the second open end respectively; then, a detachment of the detachable bracket from the casing body is achievement. Similarly, the user can install the detachable bracket to the casing body by a reverse operation.

Compared with the prior art, the device casing according to the invention provides the user convenience of rotating, detaching, and installing the detachable bracket. Therefore, the user can easily maintain and replace components on the detachable bracket, and also can easily maintain and replace components inside the device casing under the detachable bracket.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
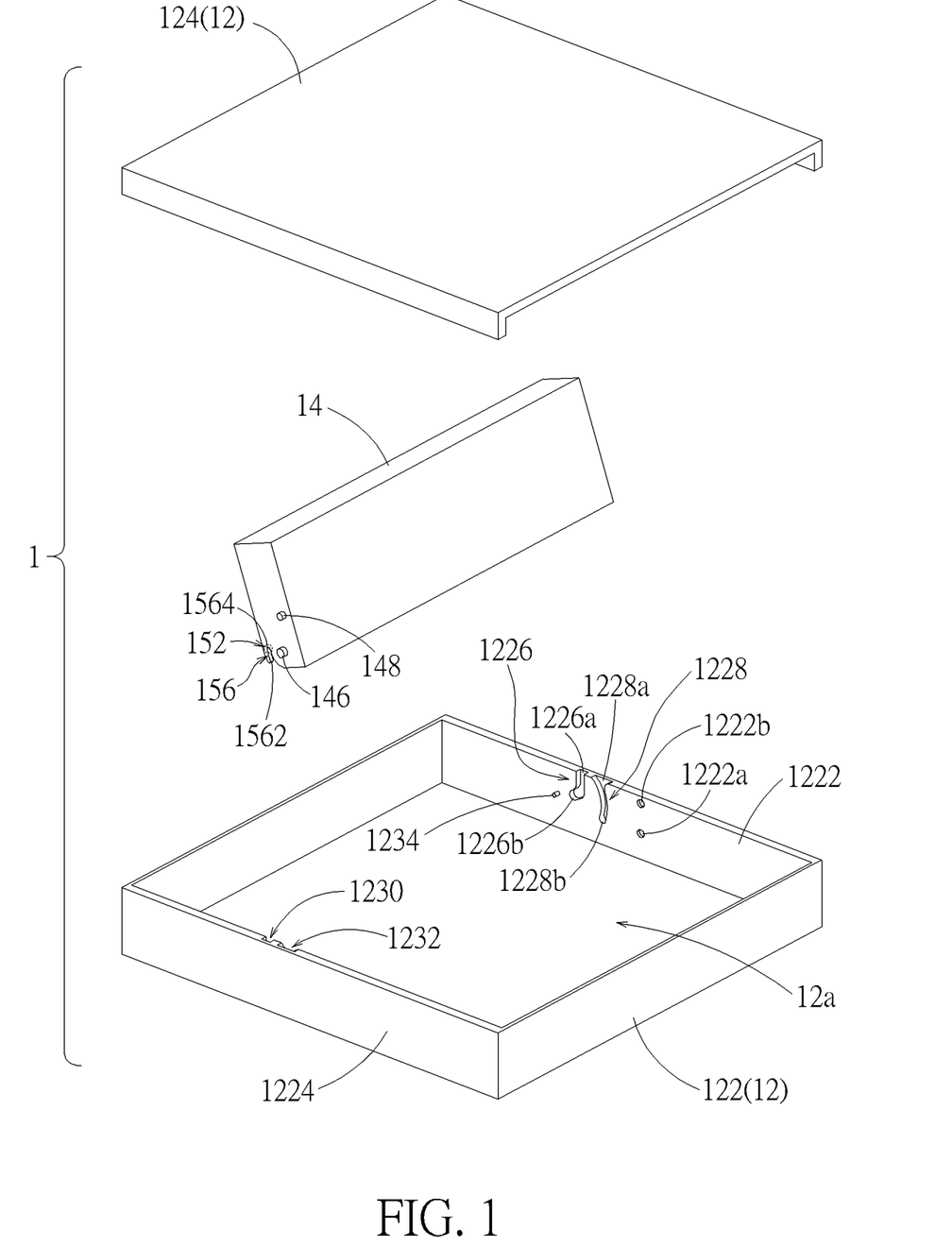
FIG. 1 is an exploded view of a device casing according to an embodiment.
Figure 2:
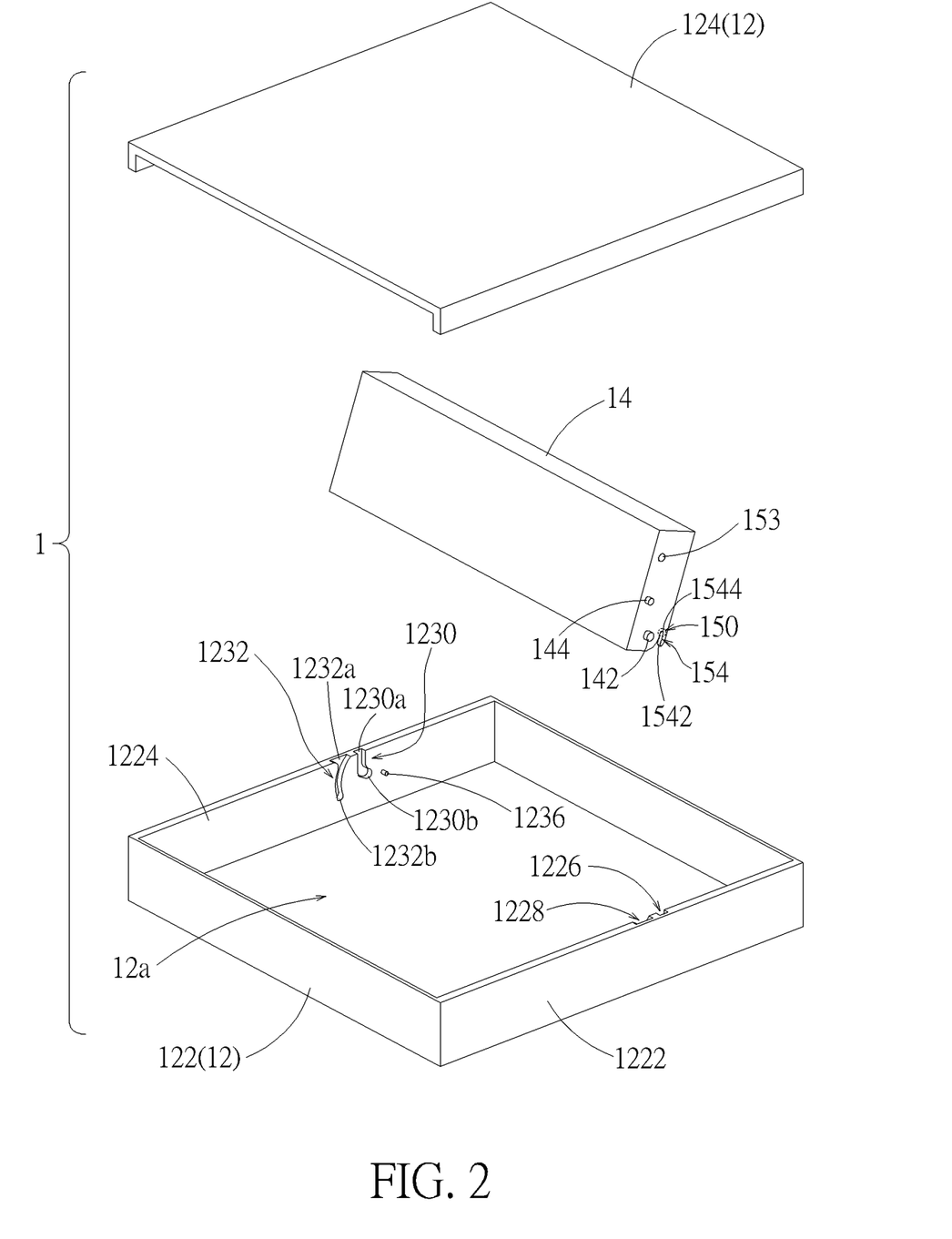
FIG. 2 is a schematic diagram illustrating the device casing in FIG. 1 in another view point.
Figure 3:
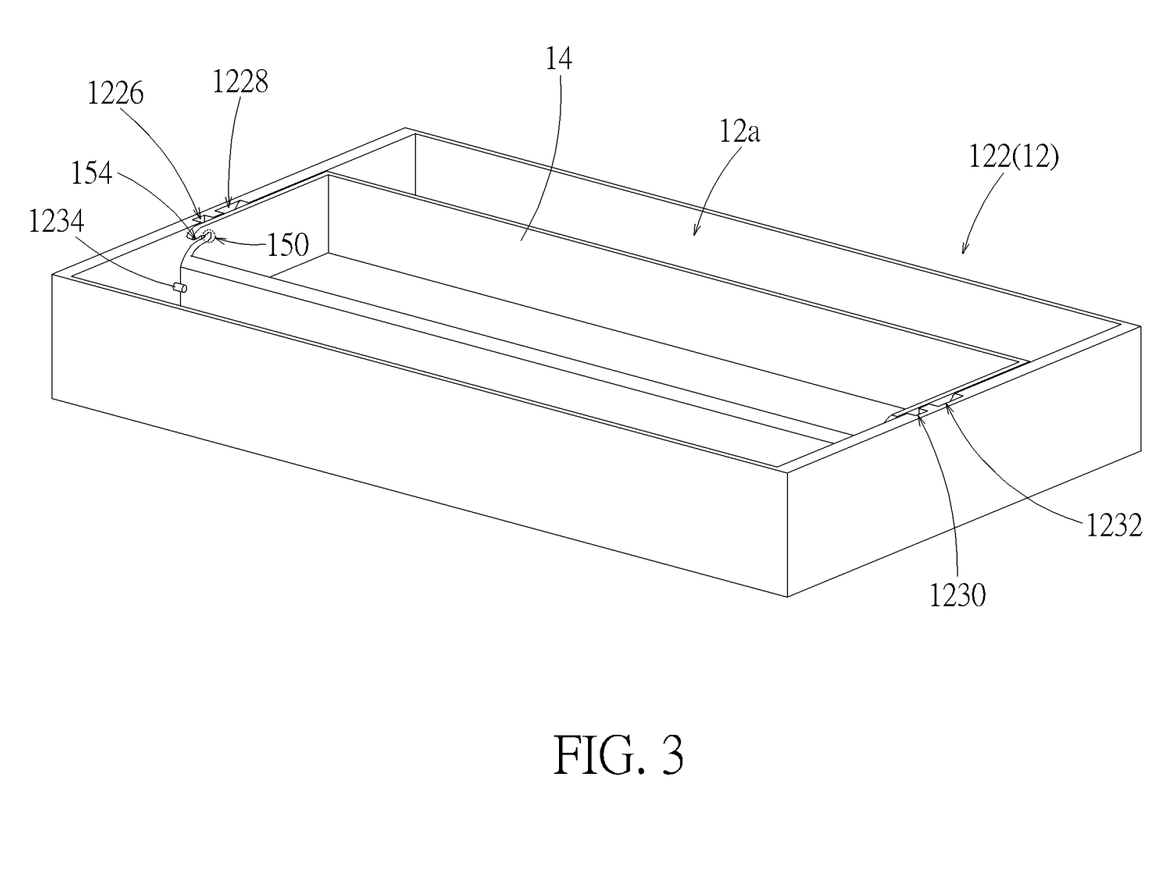
FIG. 3 is a schematic diagram illustrating installation of a detachable bracket of the device casing to a base of the device casing.

Please refer to FIG. 1 to FIG. 3. A device casing 1 according to an embodiment includes a casing body 12 and a detachable bracket 14 disposed in the casing body 12. The casing body 12 includes a base 122 and an upper cover 124. The upper cover 124 is detachably connected to the base 122 to form an accommodating space 12*a*. The base 122 has a first supporting frame 1222, a second supporting frame 1224 relative to the first supporting frame 1222, first and second guiding slots 1226 and 1228 formed on the first supporting frame 1222, and third and fourth guiding slots 1230 and 1232 formed on second supporting frame 1224. The detachable bracket 14 has a first sliding post 142, a second sliding post 144, a third sliding post 146, and a fourth sliding post 148. By the first sliding post 142, the second sliding post 144, the third sliding post 146, and the fourth sliding post 148 sliding in or out the first guiding slot 1226, the second guiding slot 1228, the third guiding slot 1230, and the fourth guiding slot 1232 respectively, the detachable bracket 14 can be detachably disposed between the first supporting frame 1222 and the second supporting frame 1224 or detached from the base 122 correspondingly. In practice, the device casing 1 can be applied but not limited to servers. The detachable bracket 14 can be used for carrying one or more electronic components (e.g. hard drive disks, expansion cards and so on). Because of the detachable design of the detachable bracket 14, a user can easily maintain, replace the hard drive disks carried by the detachable bracket 14. Furthermore, in the embodiment, the first supporting frame 1222 and the second supporting frame 1224 are the sidewalls of the base 122; however, it is not limited thereto in practice. For example, the first supporting frame 1222 and the second supporting frame 1224 are realized by structures at the inner sides of the sidewalls of base 122.

In the embodiment, the first guiding slot 1226 has a first open end 1226*a* and a first closed end 1226*b*. The second guiding slot 1228 has a second open end 1228*a* and a second closed end 1228*b*. The third guiding slot 1230 has a third open end 1230*a* and a third closed end 1230*b*. The fourth guiding slot 1232 has a fourth open end 1232*a* and a fourth closed end 1232*b*. The first sliding post 142, the second sliding post 144, the third sliding post 146, and the fourth sliding post 148 slides into the first guiding slot 1226, the second guiding slot 1228, the third guiding slot 1230, and the fourth guiding slot 1232 through the first open end 1226*a*, the second open end 1228*a*, the third open end 1230*a*, and the fourth open end 1232*a* respectively, so as to install the detachable bracket 14 to the base 122 between the first supporting frame 1222 and the second supporting frame 1224. Until the first sliding post 142, the second sliding post 144, the third sliding post 146, and the fourth sliding post 148 are stopped at the first closed end 1226*b*, the second closed end 1228*b*, the third closed end 1230*b*, and the fourth closed end 1232*b*, the installation of the detachable bracket 14 is achieved, as shown by FIG. 3.

Figure 4:
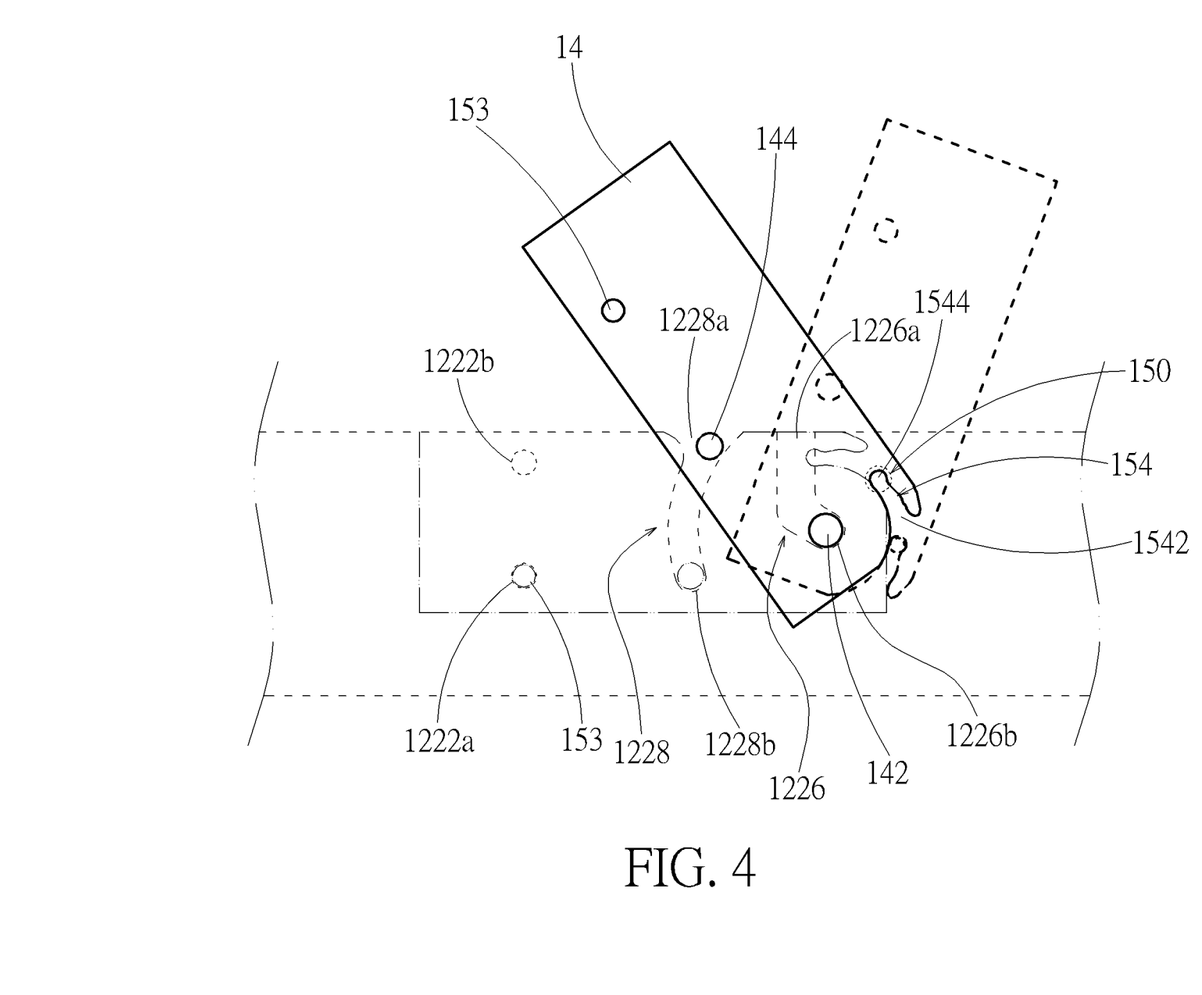
FIG. 4 is a schematic diagram illustrating rotation of the detachable bracket relative to the base in a side view.

Please also refer to FIG. 4; therein, the profile of the first supporting frame 1222 and the profiles of the first guiding slot 1226 and the second guiding slot 1228 formed on the first supporting frame 1222 are shown in dashed lines. In the embodiment, the first sliding post 142 and the second sliding post 144 have the same structures as the third sliding post 146 and the fourth sliding post 148 respectively and are disposed symmetrically to the third sliding post 146 and the fourth sliding post 148. For simplification of description, the following description will be based on interactions between the first and second sliding posts 142 and 144 and the first and second guiding slots 1226 and 1228 respectively. It is also applied to interactions between the third and fourth sliding posts 146 and 148 and the third and fourth guiding slots 1230 and 1232, which will not be described in addition.

When the detachable bracket 14 is at the installation state (as shown by FIG. 3; the profile thereof is shown in chain lines in FIG. 4), the first sliding post 142 and the third sliding post 146 are rotatably located at the first closed end 1226*b* and the third closed end 1230*b* respectively, and the second sliding post 144 and the fourth sliding post 148 are slidably located at the second closed end 1228*b* and the fourth closed end 1232*b* respectively. At this moment, the user can operate the detachable bracket 14 to slide the second sliding post 144 and the fourth sliding post 148 in the second guiding slot 1228 and the fourth guiding slot 1232 about the first sliding post 142 and the third sliding post 146 respectively, so that the detachable bracket 14 rotates relative to the base 122 (or the casing body 12). When the detachable bracket 14 is rotated upward relative to the base 122 to a detached position (of which the profile is shown in dashed lines in FIG. 4), the second sliding post 144 is located at the second open end 1228*a*. Then, the first sliding post 142 can be moved from the first closed end 1226*b* toward the first open end 1226*a* till the first sliding post 142 departs from the first guiding slot 1226; during the movement, the second sliding post 144 has departed from the second guiding slot 1228. Afterward, the detachable bracket 14 can be detached from the base 122. The detached detachable bracket 14 facilitates the operations (e.g. maintenance, replacement and so on) of the electronic components on the detachable bracket 14 by the user.

Figure 5:
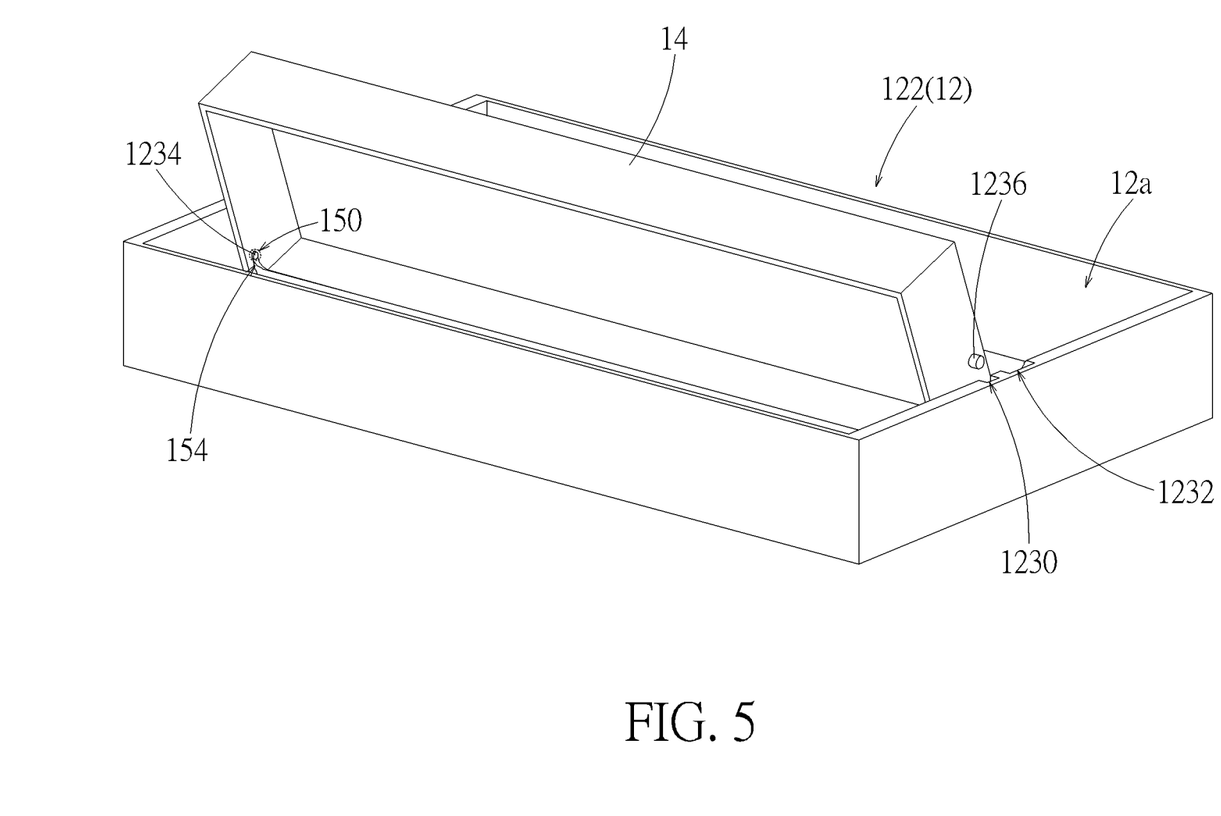
FIG. 5 is a schematic diagram illustrating the detachable bracket in FIG. 3 that rotates relative to the base to an open position.

In the embodiment, the detachable bracket 14 has a first holding structure 150 and a second holding structure 152 (shown by a circle in dashed line in FIG. 4). The base 122 has a first post 1234 and a second post 1236 disposed on the first supporting frame 1222 and the second supporting frame 1224 respectively, as shown by FIG. 1 and FIG. 2. In the embodiment, the first holding structure 150 and the second holding structure 152 have the same structure and are disposed symmetrically. The first post 1234 and the second post 1236 have the same structure and are disposed symmetrically. Similarly, for simplification of description, the following description will be based on interactions between the first holding structure 150 and the first post 1234. It is also applied to interactions between the second holding structure 152 and the second post 1236, which will not be described in addition. As shown by FIG. 4, in practice, when the detachable bracket 14 is at the installation state, the user also can rotate the detachable bracket 14 upward by the above rotating operation till the detachable bracket 14 reaches an open position (as shown by FIG. 5; the profile thereof is shown in dashed lines in FIG. 4). At this moment, the first post 1234 is held by the first holding structure 150. Thereby, the detachable bracket 14 can remain supported on the first supporting frame 1222 and the second supporting frame 1224, which facilitates maintenance, replacement and so on of the electronic components under the detachable bracket 14 in the casing body 12 by the user.

In addition, in the embodiment, the first supporting frame 1222 has a first positioning hole 1222*a* and a second positioning hole 1222*b*. The detachable bracket 14 has a positioned protrusion 153. The detachable bracket 14 can be positioned by the positioned protrusion 153 selectively fitting in the first positioning hole 1222*a* or the second positioning hole 1222*b*. Therein, when the detachable bracket 14 is at the installation state, the positioned protrusion 153 fits in the first positioning hole 1222*a*. The user can rotate the detachable bracket 14 upward till the positioned protrusion 153 fits in the second positioning hole 1222*b*, so that the detachable bracket 14 shows a semi-opened state and facilitates maintenance, replacement and so on of the electronic components disposed on the detachable bracket 14 by the user. At this moment, the second sliding post 144 is located in the second guiding slot 1228. In practice, the first supporting frame 1222 can be provided with more positioning holes for providing the detachable bracket 14 more positioning angles. Furthermore, the first positioning hole 1222*a* and the second positioning hole 1222*b* can be disposed on the detachable bracket 14 instead; the positioned protrusion 153 is disposed on the first supporting frame 1222 correspondingly. This structural configuration also can perform the above positioning effect. Furthermore, in practice, the first positioning hole 1222*a* and the second positioning hole 1222*b* can be disposed on the second supporting frame 1224 instead; the positioned protrusion 153 is disposed on a corresponding portion of the detachable bracket 14. Furthermore, the above positioning structures can be disposed on the both sides of the detachable bracket 14.

Furthermore, in the embodiment, the detachable bracket 14 has a first sliding slot 154 and a second sliding slot 156. The first sliding slot 154 has a first entry end 1542 and a first distal end 1544. The second sliding slot 156 has a second entry end 1562 and a second distal end 1564. The first holding structure 150 is formed at the first distal end 1544 and performs a holding effect by a necking structure. The first post 1234 slides into the first sliding slot 154 through the first entry end 1542 so as to be held by the first holding structure 150. Similarly, the second holding structure 152 is formed at the second distal end 1564 and also performs a holding effect by a necking structure. The second post 1236 slides into the second sliding slot 156 through the second entry end 1562 so as to be held by the second holding structure 152. In the embodiment, when the first post 1234 and the second post 1236 are held by the first holding structure 150 and the second holding structure 152 respectively, the second sliding post 144 and the fourth sliding post 148 have departed from the second guiding slot 1228 and the fourth guiding slot 1232 respectively; therefore, the first sliding slot 154 and the second sliding slot 156 are conducive to the stability of the rotation of the detachable bracket 14 relative to the base 122. Furthermore, in the embodiment, when the detachable bracket 14 is rotated upward relative to the base 122 till the second sliding post 144 and the fourth sliding post 148 depart from the second guiding slot 1228 and the fourth guiding slot 1232, the first post 1234 and the second post 1236 relatively slide into the first sliding slot 154 and the second sliding slot 156 through the first entry end 1542 and the second entry end 1562 respectively. In other words, during the rotation of the detachable bracket 14 relative to the base 122, the detachable bracket 14 substantially keeps two structural connections with the first supporting frame 1222 and the second supporting frame 1224 respectively; however, it is not limited thereto in practice. For example, after the second sliding post 144 and the fourth sliding post 148 depart from the second guiding slot 1228 and the fourth guiding slot 1232 respectively, the detachable bracket 14 needs to rotate further by a small angle so as to make the first post 1234 and the second post 1236 enter the first sliding slot 154 and the second sliding slot 156 respectively. For another example, it is also practicable to support the detachable bracket 14 on the first supporting frame 1222 and the second supporting frame 1224 by the first post 1234 and the second post 1236 blocking the structural edges of the detachable bracket 14; therein, it is unnecessary to disposed the first holding structure 150 and the second holding structure 152.

Figure 6:
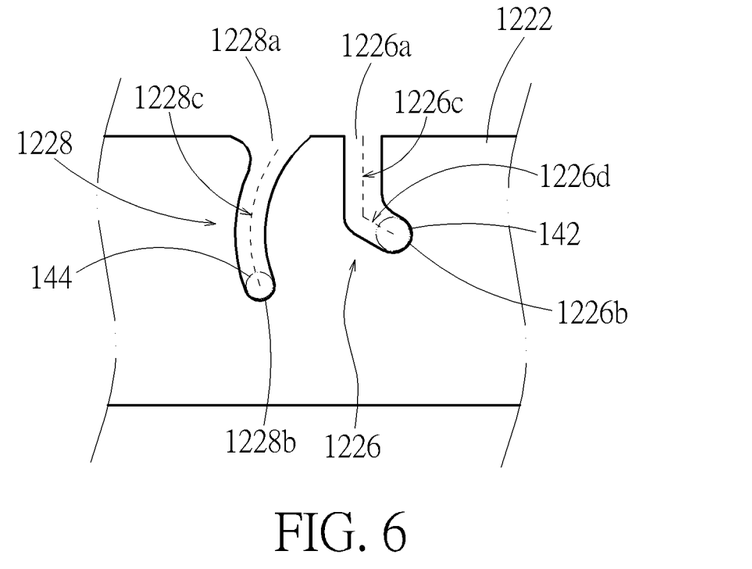
FIG. 6 is a side view of a first supporting frame of the base.

Furthermore, in practice, by designing the extension paths of the first guiding slot 1226 and the second guiding slot 1228, the detachable bracket 14 relative to the base 122 can move (including rotating and sliding) steadily, without excessively shaking. Please refer to FIG. 6; for simplification of description, the first guiding slot 1226 and the second guiding slot 1228 are still shown in solid lines in the figure. In the embodiment, the second guiding slot 1228 has a curved section 1228c (of which the extension path is indicated by a dashed line). The curved section 1228c extends about the first closed end 1226b. The second closed end 1228b is located at the curved section 1228c. The detachable bracket 14 can rotate about the first sliding post 142 (indicated by a chain line in FIG. 6), so that the second sliding post 144 (indicated by a chain line in FIG. 6) slides in the curved section 1228c. The first guiding slot 1226 includes a vertical section 1226c (of which the extension is indicated by a dashed line) and a slanting section 1226d (of which the extension is indicated by a dashed line) connected to the vertical section 1226c. The slanting section 1226d extends obliquely downward from the vertical section 1226c. The first open end 1226a is located at the vertical section 1226c. The first closed end 1226b is located at the slanting section 1226d. Furthermore, in the embodiment, the slanting section 1226d extends away from the vertical section 1226c and perpendicular to the second guiding slot 1228. The second open end 1228a of the second guiding slot 1228 is trumpet-shaped, so that when the first sliding post 142 slides in the slanting section 1226d, there is no structural interference between the second sliding post 144 and the second guiding slot 1228. It is conducive to the detachment of the detachable bracket 14.

Figure 7:
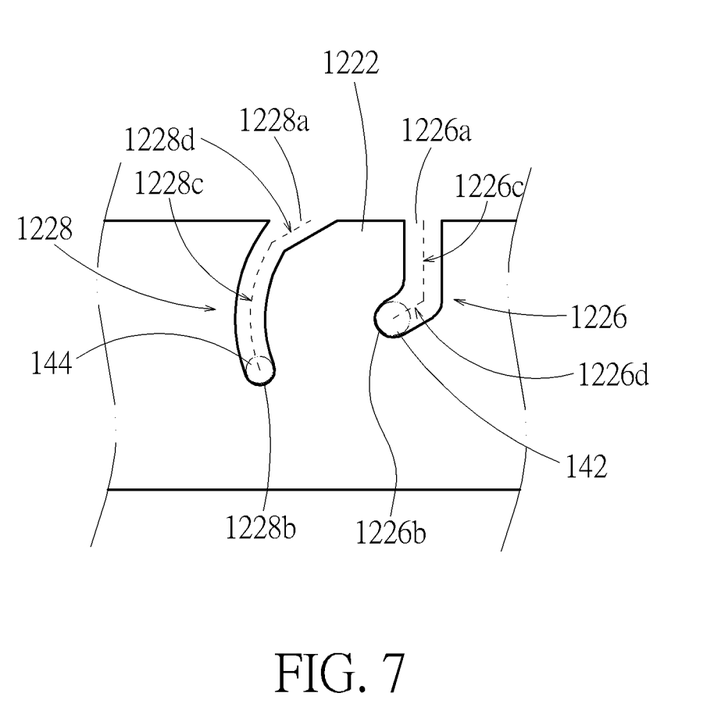
FIG. 7 is a side view of a first supporting frame according to another embodiment.
Figure 8:
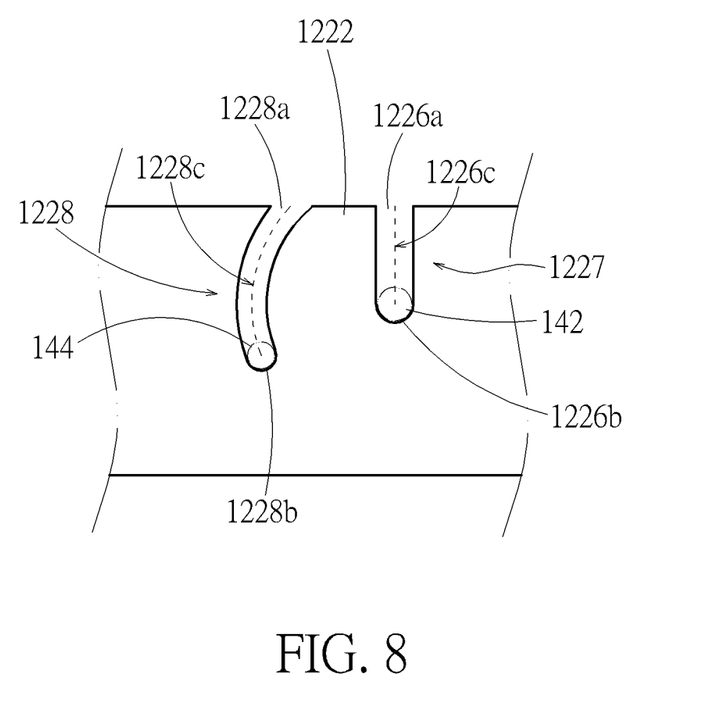
FIG. 8 is a side view of a first supporting frame according to another embodiment.

Please refer to FIG. 7. In another embodiment, the slanting section 1226d extends from the vertical section 1226c toward the second guiding slot 1228 and perpendicular to the second guiding slot 1228. Furthermore, the second guiding slot 1228 further has a slanting section 1228d (of which the extension path is indicated by a dashed line) that is parallel to the slanting section 1226d of the first guiding slot 1226. Thereby, when the first sliding post 142 slides in the slanting section 1226d, the second sliding post 144 slides in the slanting section 1228d and there is no structural interference between the second sliding post 144 and the second guiding slot 1228. It is conducive to the detachment of the detachable bracket 14. For another example, as shown by FIG. 8, the first guiding slot 1227 is a vertical guiding slot, which also can allow the detachable bracket 14 to rotate and slide relative to the base 122 for convenience of the installation and detachment of the detachable bracket 14.

As the device casing 1 and variations thereof described above are based on the fact that the device casing 1 is structurally symmetrical; however, it is not limited thereto in practice. For example, using the first sliding post 142, the second sliding post 144, and the third sliding post 146 in coordination with the first guiding slot 1226, the second guiding slot 1228, and the third guiding slot 1230 also can achieve the effect of the detachable bracket 14 stably rotating and sliding relative to the base 122. For another example, using one of the first holding structure 150 and the second holding structure 152 (in coordination with the first post 1234 and the second post 1236) also can achieve the effect of the base 122 supporting the detachable bracket 14 thereon. Further using the corresponding first sliding slot 154 or the corresponding second sliding slot 156 also can achieve the effect of the detachable bracket 14 stably rotating relative to the base 122.

As described above, by the structural constraint between the guiding slots 1226, 1228, 1230 and 1232 and the sliding posts 142, 144, 146 and 148 respectively, in principle, the user can rotate the detachable bracket 14 relative to the base 122 without tools and also can easily install or detach the detachable bracket 14 for facilitating maintenance and replacement of the electronic components on the detachable bracket 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A device casing, comprising:
 a casing body, having a first supporting frame, a second supporting frame relative to the first supporting frame, first and second guiding slots formed on the first supporting frame, and a post disposed on the first supporting frame or the second supporting frame, the first guiding slot having a first open end and a first closed end, the second guiding slot having a second open end and a second closed end; and a detachable bracket, detachably disposed between the first supporting frame and the second supporting frame and having a first sliding post, a second sliding post, a sliding slot, and a holding structure disposed corresponding to the post, the first sliding post being rotatably disposed at the first closed end, the second sliding post being slidably disposed at the second closed end, the sliding slot having an entry end and a distal end, the holding structure being formed at the distal end, when the detachable bracket rotates upward relative to the casing body, the post being held by the holding structure.

2. The device casing according to claim 1, wherein when the detachable bracket rotates upward relative to the casing body so that the second sliding post departs from the second guiding slot, the post slides into the sliding slot from the entry end of the sliding slot.

3. The device casing according to claim 1, wherein the second guiding slot has a curved section, the curved section extends about the first closed end, the second closed end is located at the curved section, and the detachable bracket is rotatable about the first sliding post, so that the second sliding post slides in the curved section.

4. The device casing according to claim 3, wherein the first guiding slot comprises a vertical section and a slanting section connected to the vertical section, the slanting section extends obliquely downward from the vertical section, the first open end is located at the vertical section, and the first closed end is located at the slanting section.

5. The device casing according to claim 4, wherein the slanting section extends toward the second guiding slot from the vertical section.

6. The device casing according to claim 4, wherein the slanting section extends from the vertical section in a direction away from the second guiding slot.

7. The device casing according to claim 4, wherein the slanting section extends from the vertical section perpendicular to the second guiding slot.

8. The device casing according to claim 3, wherein the first guiding slot is a vertical guiding slot.

9. The device casing according to claim 1, wherein the first supporting frame or the second supporting frame comprises a positioned protrusion or a plurality of positioning holes, the detachable bracket comprises the plurality of positioning holes or the positioned protrusion correspondingly, and the positioned protrusion is selectively engaged with one of the plurality of positioning holes.

\* \* \* \* \*